(12) United States Patent
Yamaguchi et al.

(10) Patent No.: US 7,778,299 B2
(45) Date of Patent: Aug. 17, 2010

(54) SEMICONDUCTOR LASER

(75) Inventors: Tsutomu Yamaguchi, Tokyo (JP); Takehiro Nishida, Tokyo (JP); Yuji Okura, Tokyo (JP); Tadashi Takase, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 117 days.

(21) Appl. No.: 12/251,529

(22) Filed: Oct. 15, 2008

(65) Prior Publication Data
US 2009/0290612 A1 Nov. 26, 2009

(30) Foreign Application Priority Data
May 21, 2008 (JP) .............................. 2008-132980

(51) Int. Cl.
H01S 5/00 (2006.01)

(52) U.S. Cl. .................................. 372/46.012; 372/50.1

(58) Field of Classification Search ............ 372/46.012, 372/43.01, 50.1, 50.12, 64
See application file for complete search history.

(56) References Cited

U.S. PATENT DOCUMENTS 6,375,364 B1  4/2002  Wu
6,798,815 B2 *  9/2004  Schmidt et al. ............... 372/64
2006/0098704 A1 *  5/2006  Yamaguchi et al. ...... 372/43.01

FOREIGN PATENT DOCUMENTS

| JP | 2-20089 A | 1/1990 |
|---|---|---|
| JP | 2005-524234 A | 8/2005 |
| JP | 2006-165513 A | 6/2006 |
| JP | 2006-303267 A | 11/2006 |

* cited by examiner

Primary Examiner—Minsun Harvey
Assistant Examiner—Patrick Stafford
(74) Attorney, Agent, or Firm—Leydig, Voit & Mayer, Ltd.

(57) ABSTRACT

A semiconductor laser having a double channel ridge structure includes: a ridge; channel portions located on opposite sides of the ridge, sandwiching the ridge, and having an equivalent refractive index lower than the equivalent refractive index of the ridge; and layers defining outside surfaces of the channel portions and, having an equivalent refractive index higher than the equivalent refractive index of the channel portions. The ridge has a flare ridge structure with a width that is widened toward a light outgoing end surface, and the width of the channel portions where the width of the ridge is the narrowest is wider than the channel portions at the light outgoing end surface.

10 Claims, 7 Drawing Sheets the difference in the central angles
of the far-field patterns (°)

SEMICONDUCTOR LASER

BACKGROUND OF THE INVENTION

1. Field of the Invention

The present invention relates to a semiconductor laser; specifically to a semiconductor laser equipped with a waveguide ridge.

2. Background Art

The present invention relates to a semiconductor laser used in an optical disk system, optical communications, or the like: more specifically to a discrete and monolithic semiconductor laser with a double-channel type ridge structure. The double-channel type ridge structure means the configuration wherein a ridge is sandwiched between channel (trench) portions having a low equivalent refractive index, and the channel portions are further sandwiched between layers having a high equivalent refractive index (for example, refer to Japanese Patent No. 3857294, FIG. 13).

With the rise of output of laser beams, a flare-type laser having a ridge structure, wherein the ridge width is varied in a laser resonator and the ridge width is widened toward the light outgoing end surface, has been adopted. This structure has advantage to realize high output, as well as to lower the device resistance, operating voltage, and operating current. The channel width of conventional lasers having a flare ridge type double channel structure has been designed to have a constant value regardless of the variation of ridge width (for example, refer to Japanese Patent Application Laid-Open No. 2006-303267, Japanese Patent No. 2695440, National Publication of International Patent Application No. 2005-524234).

SUMMARY OF THE INVENTION

Conventional semiconductor lasers having a flare ridge type double channel structure have a problem wherein the strength center and shape of the far-field pattern in the horizontal direction may vary with the variation of optical output, and stable yield cannot be obtained.

The present invention has been made to solve the above-described problem, and it is an object of the present invention to provide a semiconductor laser which emits laser beams wherein the variation of the strength center of the far-field pattern in the horizontal direction accompanying the variation of optical output is suppressed and the shape of the far-field pattern is stabilized.

According to one aspect of the present invention, a semiconductor laser having a double channel type ridge structure, comprises: a ridge; channel portions located on both sides of said ridge, sandwiching said ridge, and having an equivalent refractive index lower than the equivalent refractive index of said ridge; and layers on the outsides of said channel portions, having an equivalent refractive index higher than the equivalent refractive index of said channel portions; wherein said ridge has a flare ridge structure whose width is widened toward a light outgoing end surface, and the width of the channel portions at the both sides of the place where the width of said ridge is the narrowest is wider than the width of the channel portions at said light outgoing end surface.

The semiconductor laser according to the present invention has a double channel type ridge structure having a flare ridge structure, and by making the width of the channel portions on the both sides of the place where the ridge width is the narrowest wider than the channel width at the light outgoing end surface, the shape of the far-field pattern in the horizontal direction can be improved, and the center of the far-field pattern can be stabilized.

Other and further objects, features and advantages of the invention will appear more fully from the following description.

DETAILED DESCRIPTION OF THE PREFERRED EMBODIMENTS

First Embodiment

Figure 1:
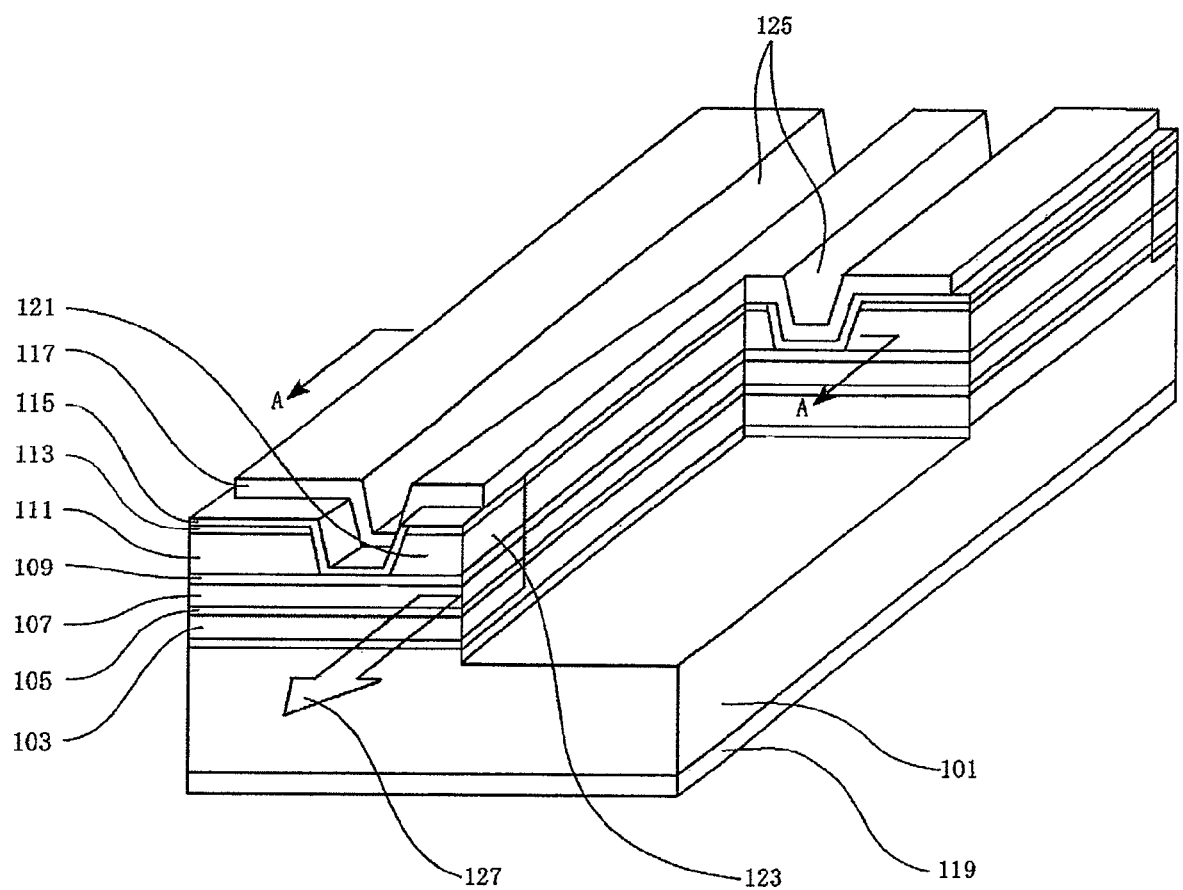
FIG. 1 is a perspective view showing the structure of a laser according to the first embodiment.
Figure 2:
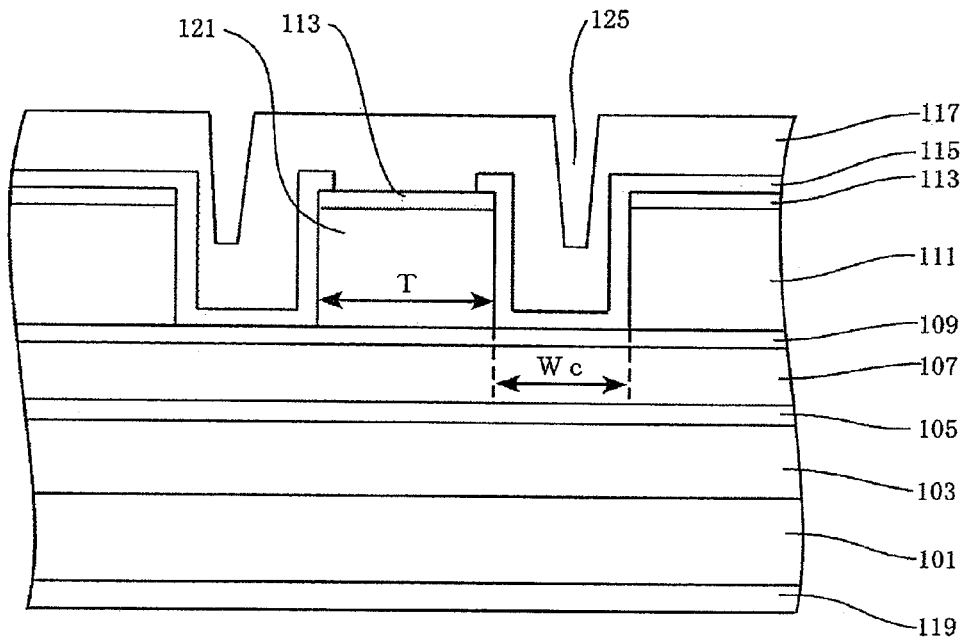
FIG. 2 is a sectional view along the line A-A in FIG. 1.

The first embodiment is a semiconductor laser having a double channel type ridge structure, and composed of a region 1 having a ridge shape wherein the ridge width is constant and is not varied, and a flare region 2 wherein the ridge width is widened toward the light outgoing end surface. The oscillation wavelength is around 660 nm. FIG. 1 is a perspective view showing the structure of a laser according to the first embodiment. FIG. 2 is a sectional view along the line A-A in FIG. 1. The semiconductor laser in the first embodiment is a semiconductor laser having a double channel type ridge structure formed by sandwiching a ridge 121 with two trench sections (channels) 125. In FIG. 2, the ridge width and the channel width are represented by T and Wc, respectively.

Figure 3:
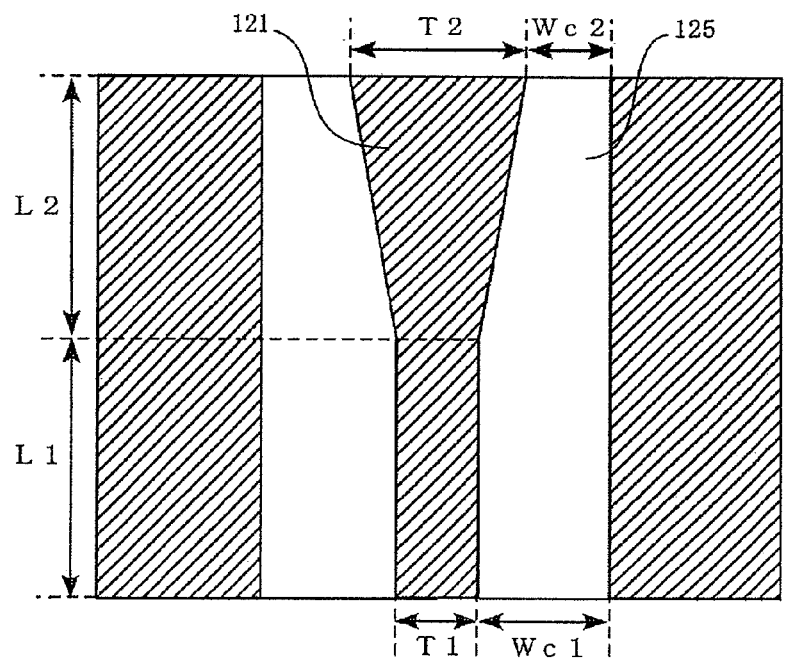
FIG. 3 shows the appearance of a pattern in the vicinity of the ridge including channels of the first embodiment viewed from the above.

The appearance of a pattern in the vicinity of the ridge including channels of the first embodiment viewed from the above is shown in FIG. 3. In FIG. 3, the length of the region 1 is represented by L1, the length of the region 2 is represented by L2, the ridge widths corresponding to respective regions are represented by T1 and T2, and the channel widths corresponding to respective regions are represented by Wc1 and Wc2.

In the semiconductor laser having the double channel type flare ridge structure, the channel width of the light outgoing end surface section is narrower than the width of the channel portion at the place where the ridge width is the narrowest. By forming such a structure, the variation of the strength center of the far-field pattern in the horizontal direction accompanying the variation of optical output is suppressed.

In the place where the ridge width is the narrowest, the width of the channel portions is optimized so that the field intensity at the ridge center of the laser and the field intensity at the outside edges of the channels satisfy the following conditions:

When $$E = A\cos(ux)(x \geq T/2) \quad (1)$$

$$E = A\cos(uT/2)\exp(-w(|x|-T/2))(x \geq T/2) \quad (2)$$

$$u^2 + w^2 = (n_1^2 - n_2^2)(2\pi/\lambda)^2 T^2 \quad (3)$$

$$w = u \cdot \tan(u) \quad (4)$$

where E represents electric field; A represents a predetermined factor; x represents the distance from the center of the ridge; T represents the width of the ridge; $n_1$ represents the equivalent refractive index of the ridge; $n_2$ represents the equivalent refractive index of the channel portion; λ represents the oscillation wavelength of the semiconductor laser; and Wc represents the width of the channel portion;

E2/E1, which is the ratio of electric field E1 at x=0 to electric field E2 at x=T/2+Wc calculated by equations (1) to (4) is determined to satisfy $$0.0001 \leq E2/E1 \leq 0.01 \quad (5)$$

Figure 4:
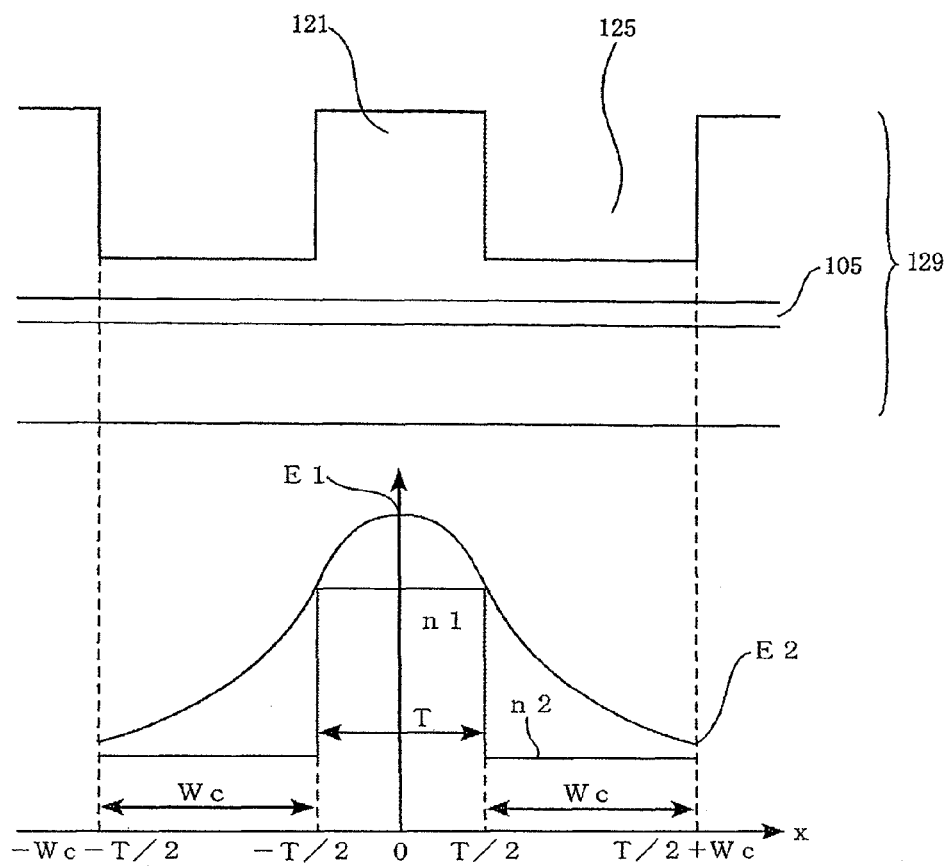
FIG. 4 shows the above-described parameters, and the refractive index distribution and field distribution in the vicinity of the ridge.

The above-described parameters, and the refractive index distribution and field distribution in the vicinity of the ridge are shown in FIG. 4. By determining the width of the channel portion in the place where the ridge width is the narrowest, the shape of the far-field pattern in the horizontal direction is further improved, and the center of the far-field pattern can also be stabilized.

In the first embodiment of the present invention, the distance from the center of the ridge portion to the outside edge of the channels is constant. Such configuration allows easier manufacturing processing and higher mass productivity.

The structure of the double channel type flare ridge semiconductor laser according to the first embodiment, and the method of the manufacture thereof will be briefly described.

In FIG. 1, an n-AlGaInP lower clad layer 103 is formed on an n-type (n) GaAs substrate 101. On the n-AlGaInP lower clad layer 103, an active layer 105 having a well layer composed of GaInP and a barrier layer composed of AlGaInP (hereinafter referred to as "MQW active layer") is formed.

On the active layer 105, a p-type (p-) AlGaInP first upper clad layer 107 and an etching stopper layer 109 are sequentially formed. On the etching stopper layer 109, a ridge 121 is linearly formed. A p-AlGaInP second upper clad layer 111 is linearly formed along the ridge 121 with two trench portions 125 formed on the both sides of the ridge 121 intervening therein.

On the upper surfaces of the ridge 121 and the p-AlGaInP second upper clad layer 111, a p-GaAs contact layer 113 is formed, and an insulating film 115 is formed thereon. On the insulating film 115, a p-electrode 117 composed of a gold-plated thin metal film is formed. The insulating film 115 on the ridge 121 is opened, and the p-electrode 117 is electrically connected to the p-GaAs contact layer 113.

In the vicinity of the end surface of the semiconductor laser 129, a window region 123 is formed. On the lower surface of the n-GaAs substrate 101, an n-electrode 119 is formed. The reference numeral 127 denotes laser beams.

In the above-described example, the composition of AlGaInP is accurately represented by $(Al_xGa_{1-x})\,0.5In0.5P$. The elemental ratio x of the n-AlGaInP lower clad layer 103 is 0.5 to 0.7, the elemental ratio x of the p-AlGaInP first upper clad layer 107 is 0.5 to 0.7, and the elemental ratio x of the p-AlGaInP second upper clad layer 111 is 0.5 to 0.7.

The thickness of the n-AlGaInP lower clad layer 103 is 1.5 to 4 μm, the thickness of the p-AlGaInP first upper clad layer 107 is 0.1 to 1 μm, and the thickness of the p-AlGaInP second upper clad layer 111 is 0.5 to 2 μm. The carrier concentration of the n-AlGaInP lower clad layer 103 is 0.3 to $2.0 \times 10^{18}$ cm$^{-3}$, the carrier concentration of the p-AlGaInP first upper clad layer 107 is 0.3 to $2.0 \times 10^{18}$ cm$^{-3}$, the carrier concentration of the p-AlGaInP second upper clad layer 111 is 0.3 to $2.0 \times 10^{18}$ cm$^{-3}$.

In a conventional double channel type ridge structure, even if the ridge width is varied in a resonator, the channel width is not varied in the resonator, and is constant.

Whereas in the first embodiment, the ridge width is 1.5 μm at the narrowest place (T1), and 3 μm at the widest front end surface (T2). The channel width is 6 μm at the widest place (Wc1), and about 5.3 μm at the narrowest place (Wc2). The ratio L1:L2 is designed to be 1:1.

Although T1=1.5 μm and T2=3.0 μm in the first embodiment, the width can be narrowed as long as the elevation of the operating voltage causes no problems, and can be widened as long as the lowering of the kink level is allowed. Normally, it is possible to design T1 and T2 to satisfy the relationship of T1<T2 within a range of 1.0 μm to 3.0 μm for T1, and 1.5 μm to 5.0 μm for T2. Wc1 is a value determined from T1 by the equation (5), and the value of Wc2 is determined from T2 and Wc1. The ratio L1:L2 can be arbitrarily determined. Since the operating voltage elevates when L1/L2 increases, and the kink level lowers when L1/L2 decreases, L1/L2 is determined to satisfy the required performance.

Next, a method for manufacturing the semiconductor laser according to the first embodiment will be described. First, an n-AlGaInP lower clad layer 103, an MQW active layer 105, a p-type (p) AlGaInP first upper clad layer 107, an etching stopper layer 109, a p-AlGaInP second upper clad layer 111, and a p-GaAs contact layer 113 are sequentially formed on an n-GaAs substrate 101 using a crystal growing method, such as MOCVD. Next, the MQW active layer 105 is disordered by, for example, Zn diffusion in the vicinity of the surface thereof to form a window region 123. Then, the p-AlGaInP second upper clad layer 111 is selectively etched by dry etching using a resist or an insulating film as a mask, and using a sulfuric acid-based or hydrochloric acid-based etching solution, to form a ridge 121 and trench portions 125. At this time, by using an adequate etching solution such as sulfuric acid, etching is automatically stopped at the etching stopper layer 109.

Next, an insulating film 115, such as a nitride film, is formed on the entire surface, an opening is formed on the upper surface of the ridge 121 using photolithography, and a p-electrode 117 composed of a gold-plated thin metal film is formed.

Figure 5:
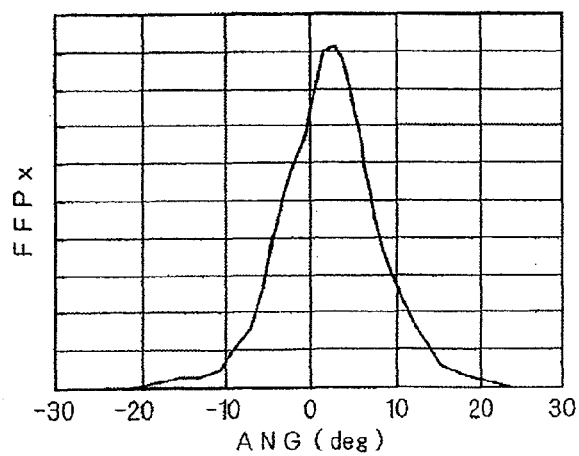
FIG. 5 shows the far-field pattern of a conventional structure.
Figure 6:
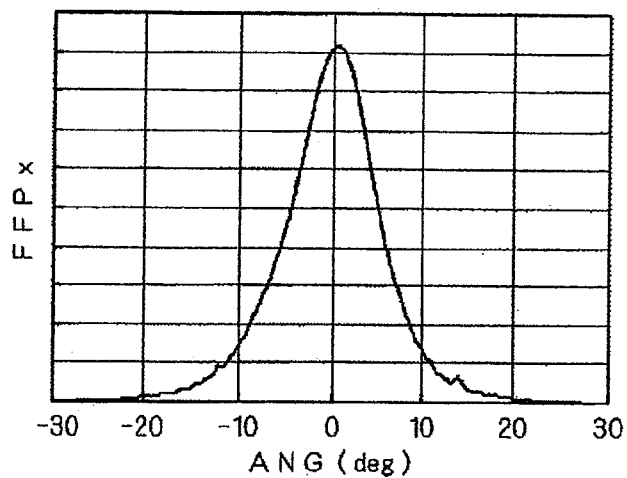
FIG. 6 shows the far-field pattern of the first embodiment.
Figure 7:
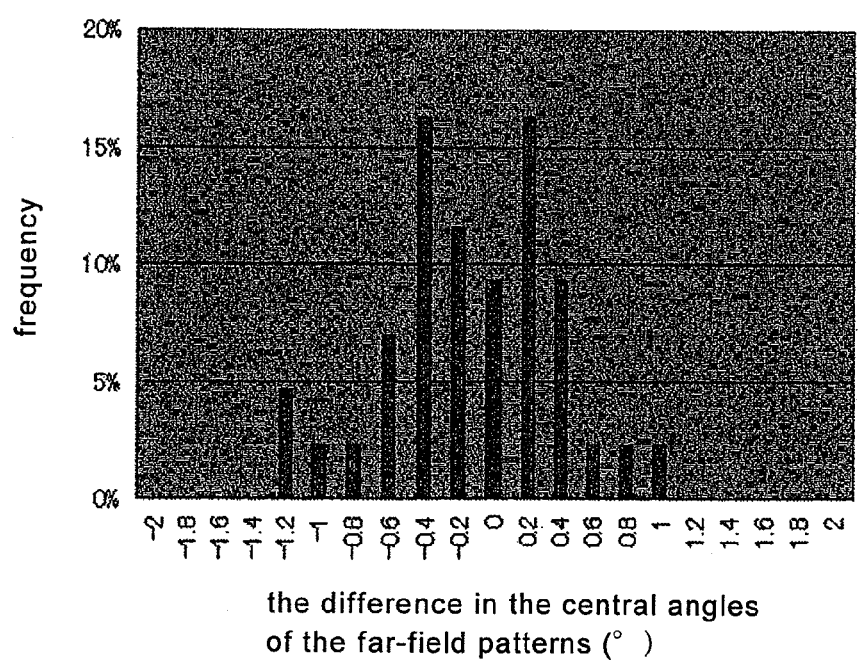
FIG. 7 shows the distribution of the conventional structure.
Figure 8:
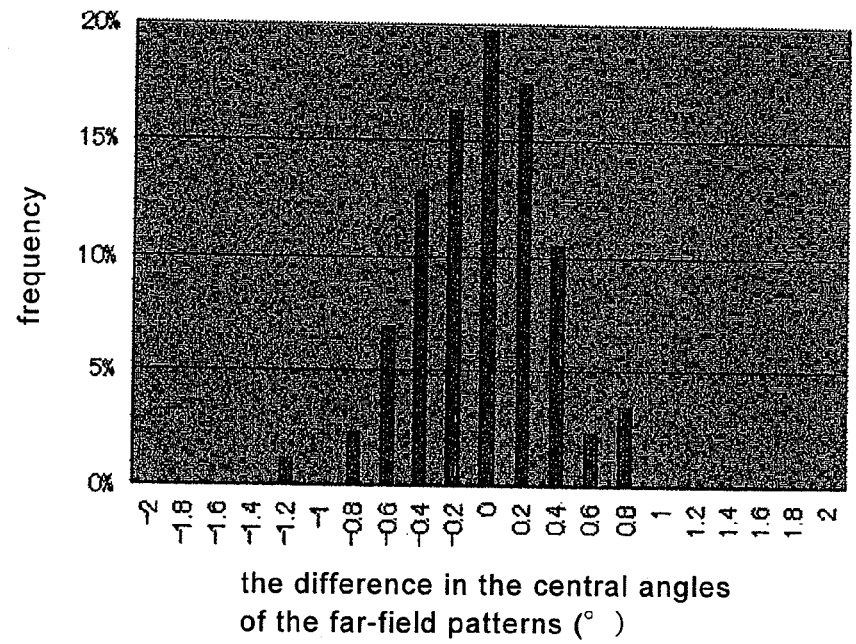
FIG. 8 shows the distribution of the first embodiment.

The far-field patterns in the horizontal direction of actually fabricated semiconductor lasers are compared in FIGS. 5 and 6. The far-field pattern of a conventional structure is shown in FIG. 5, and the far-field pattern of the first embodiment is shown in FIG. 6. The distributions of the difference in the central angles of the far-field patterns in the horizontal direction between when the optical output is 5 mW and when it is 120 mW of a conventional structure and the first embodiment are compared in FIGS. 7 and 8. The distribution of the conventional structure is shown in FIG. 7, and the distribution of the first embodiment is shown in FIG. 8. By comparing the both graphs, it is understood that the shape of the far-field pattern in the horizontal direction in the first embodiment is obviously improved by designing the width of the channel portion 125 within the range shown in the first embodiment, and the center of the far-field pattern is significantly stabilized.

Furthermore, even if a region having a laser beam absorbing effect equivalent to the effect of the double channel structure is formed by Zn diffusion or proton implantation in place of the double channel structure, the effect of suppressing the variation of the far-field pattern in the horizontal direction accompanying increase in optical output can be obtained.

Second Embodiment

Figure 9:
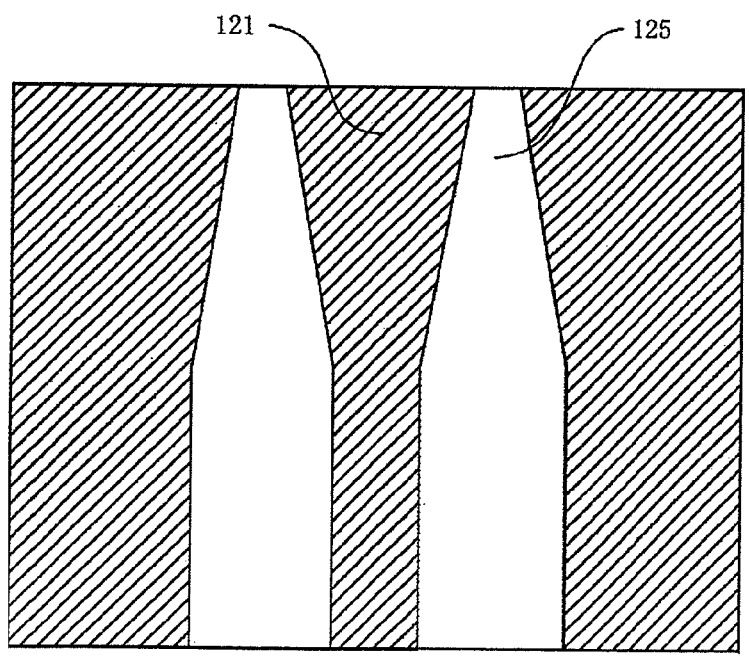
FIGS. 9 and 10 are appearance diagrams showing the pattern in the vicinity of the ridge including channels according to another embodiment of the present invention viewed from the above.
Figure 10:
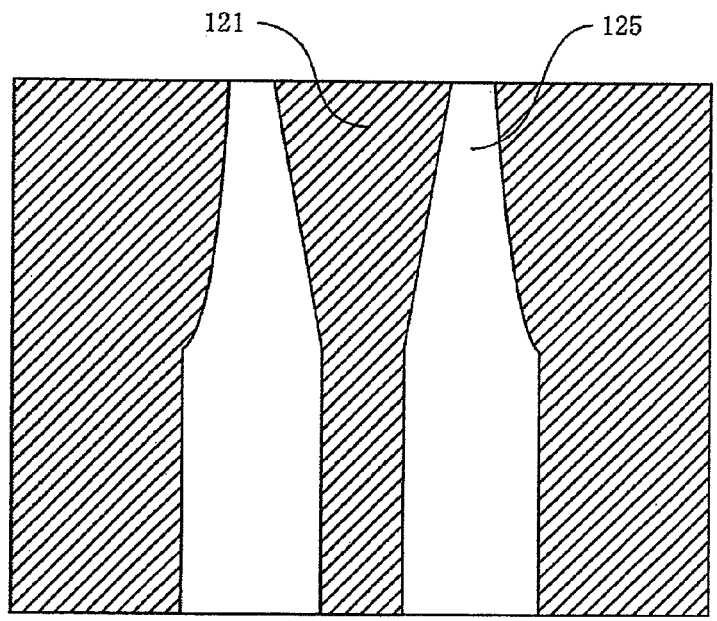

FIGS. 9 and 10 are appearance diagrams showing the pattern in the vicinity of the ridge including channels according to another embodiment of the present invention viewed from the above. In the second embodiment, the channel width of the light outgoing end surface portion is narrower than the width of the channel portion of the place where the ridge width is the narrowest as in the first embodiment. Also in the place where the ridge width is the narrowest, the width of the channel portion is optimized so that the field intensity on the ridge center of the laser and the field intensity on the outside edge of the channels satisfy the equation (5) in the first embodiment. However, the distance from the center of the ridge portion to the outside edge of the channels is not constant in the resonator. Even by such a semiconductor laser, the effect equivalent to the effect of the first embodiment can be obtained.

Third Embodiment

Figure 11:
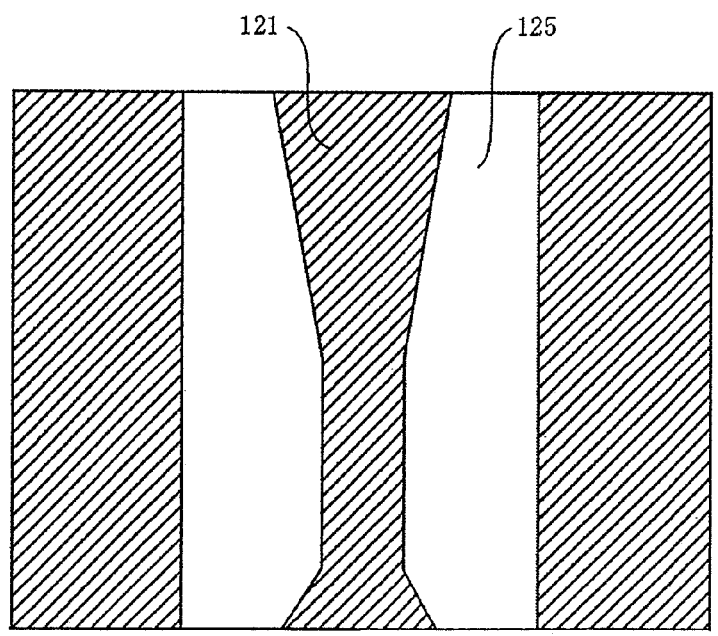
FIG. 11 is an appearance diagram showing the pattern in the vicinity of the ridge including channels according to yet another embodiment of the present invention viewed from the above.

FIG. 11 is an appearance diagram showing the pattern in the vicinity of the ridge including channels according to yet another embodiment of the present invention viewed from the above. This shows a design where the ridge width is widened toward the rear end surface direction so that the ridge width in the rear end surface direction finally matches the widest width of the light outgoing end surface and so that the front end surface of the ridge is connected to the rear end surface of the adjoining chip on the wafer under fabrication. By designing as described, productivity can be improved.

Fourth Embodiment

Figure 12:
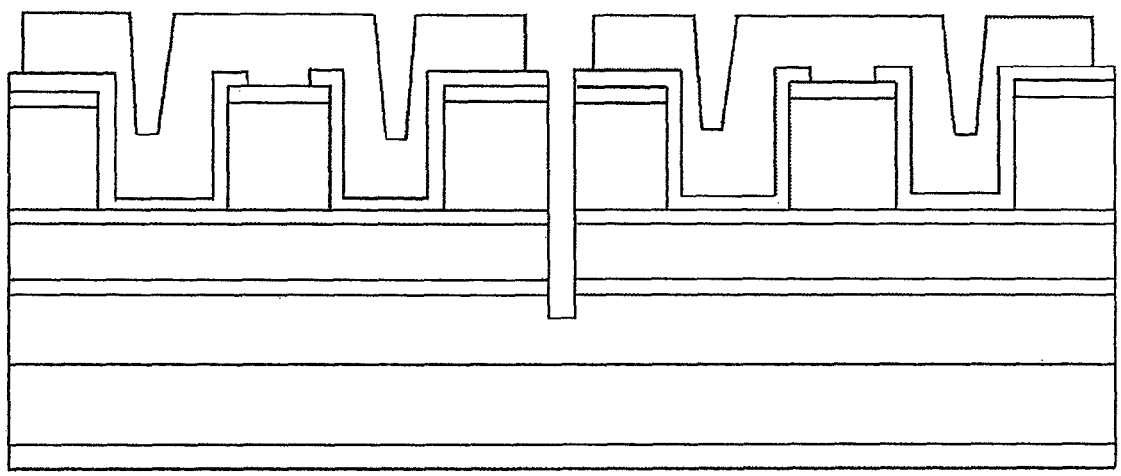
FIG. 12 is a partial sectional view showing the structure of a semiconductor laser according to still another embodiment.
Figure 13:
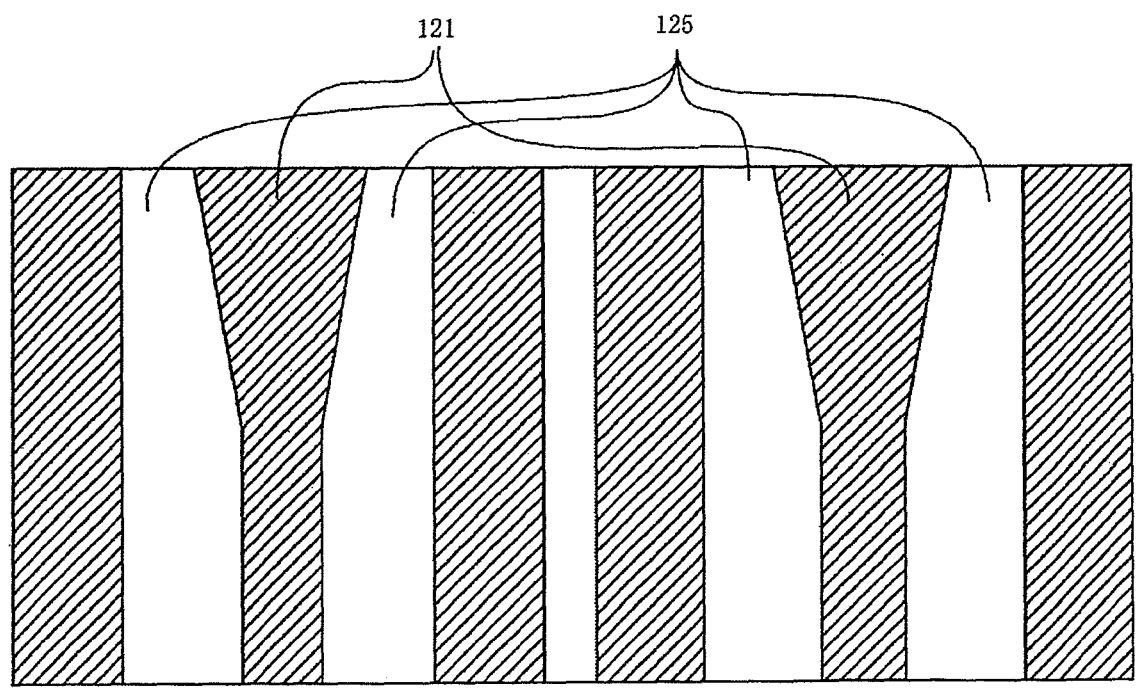
FIG. 13 is an appearance diagram of a pattern in the vicinity of the ridge including channels according to the fourth embodiment.

Although a semiconductor laser having an oscillation wavelength of around 660 nm has been described using an AlGaInP semiconductor laser as an example in the present invention, the present invention can be applied to semiconductor lasers having an oscillation wavelength in a range of 601 nm or more and 700 nm or less. In addition, the present invention can also be applied to semiconductor lasers having an oscillation wavelength in a range of 330 nm or more and 600 nm or less, or semiconductor lasers having an oscillation wavelength in a range of 701 nm or more and 900 nm or less. Furthermore, the present invention can also be applied to the above-described semiconductor lasers having different oscillation wavelength integrated into a chip. FIG. 12 is a partial sectional view showing the structure of a semiconductor laser according to still another embodiment. FIG. 13 is an appearance diagram of a pattern in the vicinity of the ridge including channels according to the fourth embodiment. In the fourth embodiment, two semiconductor lasers having the structure equivalent to the structure of the semiconductor laser shown in the first embodiment, but having different oscillation frequencies are integrated into a chip. Even in such a semiconductor laser, the shape of the far-field pattern in the horizontal direction is improved, and the center of the far-field pattern can be stabilized in the lasers having the respective oscillation frequencies.

Although typical preferable embodiments of the present invention are disclosed in the drawings and the specification, and specific terms are used, it will be obvious that these are used only in general and descriptive manner, and are not intended to limit the claims described in the specification.

As described above, the semiconductor laser according to the present invention is suited to a semiconductor laser equipped with a waveguide ridge.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2008-132980, filed on May 21, 2008 including specification, claims, drawings and summary, on which the Convention priority of the present application is based, are incorporated herein by reference in its entirety.

What is claimed is:

1. A semiconductor laser having a double channel ridge structure, comprising:
   a ridge;
   channels located on opposite sides of said ridge, sandwiching said ridge, and having an equivalent refractive index lower than the equivalent refractive index of said ridge; and
   layers defining outside surfaces of the channels, having an equivalent refractive index higher than the equivalent refractive index of said, wherein
   a first part of said ridge includes a flared ridge structure in which width of said ridge increases toward a light output end surface of said ridge structure, and
   said channels are wider where the width of said ridge is narrowest than at said light output end surface.

2. The semiconductor laser having a double channel ridge structure according to claim 1, wherein when
   the width of said ridge is T,
   the equivalent refractive index of said ridge is $n_1$,
   the equivalent refractive index of said channels is $n_2$,
   the oscillation wavelength is $\lambda$, and
   the electric field E at a distant x from the center of said ridge is:

$$E = A \cos(ux)(x \leq T/2) \quad (1)$$

$$E = A \cos(uT/2)\exp(-w(|x|-T/2))(x \geq T/2) \quad (2)$$

$$w = u \cdot \tan(u) \quad (4)$$

where A represents a predetermined factor, and
   the width Wc of the channels where the width of said ridge is the narrowest is determined so that E2/E1, which is a ratio of electric field E1 when x=0 to electric field E2 when x=T/2+Wc, satisfies:

$$00001 \leq E2/E1 \leq 0.01 \quad (5),$$

so that said semiconductor laser oscillates in a basic mode.

3. The semiconductor laser according to claim 2, wherein the distance from the center of said ridge to an outside edges of said channels is constant.

4. The semiconductor laser according to claim 1, wherein the oscillation wavelength is within a range from 601 nm to 700 nm.

5. The semiconductor laser according to claim 1, wherein the oscillation wavelength is within a range from 701 nm to 900 nm.

6. The semiconductor laser according to claim 1, wherein the oscillation wavelength is within a range from 330 nm to 600 nm.

7. A semiconductor laser device including a plurality of semiconductor lasers according to claim 1 having different oscillation wavelengths, wherein said plurality of semiconductor lasers are integrated into a chip.

8. The semiconductor laser according to claim 1, wherein the distance from the center of said ridge to outside edges of said channels is larger where the width of said ridge is narrowest than at said light output end surface.

9. The semiconductor laser according to claim 1, wherein outside edges and inside edges of respective channels converge along said flared ridge structure where the width of said ridge increases toward said light output end surface.

10. The semiconductor laser according to claim 1, wherein a second part of said ridge includes a flared ridge structure in which width of said ridge increases toward an end surface opposite said light output end surface, and the channels are wider where the width of said ridge is narrowest than at said end surface opposite said light output end surface.

\* \* \* \* \*